United States Patent
McFeely et al.

(10) Patent No.: US 9,048,296 B2
(45) Date of Patent: Jun. 2, 2015

(54) METHOD TO FABRICATE COPPER WIRING STRUCTURES AND STRUCTURES FORMED THEREBY

(75) Inventors: Fenton Read McFeely, Ossining, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 1148 days.

(21) Appl. No.: 13/025,322

(22) Filed: Feb. 11, 2011

(65) Prior Publication Data

US 2012/0205804 A1 Aug. 16, 2012

(51) Int. Cl.
*H01L 21/4763* (2006.01)
*H01L 21/768* (2006.01)
*H01L 23/532* (2006.01)

(52) U.S. Cl.
CPC .... *H01L 21/76882* (2013.01); *H01L 23/53238* (2013.01); *H01L 21/76846* (2013.01); *H01L 2924/0002* (2013.01)

(58) Field of Classification Search
CPC ........... H01L 23/53238; H01L 21/76882; H01L 21/76846; H01L 2924/00; H01L 2924/0002; C25D 7/123; Y10S 977/70; Y10S 977/742; Y10S 977/745; Y10S 977/748; Y10S 977/75; Y10S 977/753; Y10S 977/789; Y10S 977/842; Y10S 977/843
USPC ........ 438/633, 638, 643, 650, 663, 674, 675, 438/678, 686, 687; 257/E21.495, E23.01
See application file for complete search history.

(56) References Cited

U.S. PATENT DOCUMENTS

| | | | |
|---|---|---|---|
| 5,744,376 A | 4/1998 | Chan et al. | |
| 6,635,566 B1 | 10/2003 | Blosse et al. | |
| 7,253,103 B2 | 8/2007 | Iwasaki et al. | |
| 7,264,846 B2 | 9/2007 | Chang et al. | |
| 7,396,762 B2 | 7/2008 | Hsu et al. | |
| 7,442,267 B1 | 10/2008 | Webb et al. | |
| 7,585,765 B2 | 9/2009 | Yang et al. | |
| 7,704,879 B2 * | 4/2010 | Suzuki | 438/650 |
| 2007/0059502 A1 * | 3/2007 | Wang et al. | 428/209 |
| 2010/0084766 A1 | 4/2010 | Yang et al. | |

OTHER PUBLICATIONS

S. M. Rossnagel, "Thin film deposition with physical vapor deposition and related technologies," J. Vac. Sci. Technol. A, vol. 21, No. 5, 2003, pp. S74-S87.
J.Kim et al., "Cu Wettability and Diffusion Barrier Property of Ru Thin Film for Cu Metallization." J. Electrochem. Soc., vol. 152, No. 8, 2005, pp. G594-G600.

* cited by examiner

*Primary Examiner* — Michelle Mandala
(74) *Attorney, Agent, or Firm* — Scully, Scott, Murphy & Presser, P.C.; Vazken Alexanian

(57) ABSTRACT

Techniques formation of high purity copper (Cu)-filled lines and vias are provided. In one aspect, a method of fabricating lines and vias filled with high purity copper with is provided. The method includes the following steps. A via is etched in a dielectric. The via is lined with a diffusion barrier. A thin ruthenium (Ru) layer is conformally deposited onto the diffusion barrier. A Cu layer is deposited on the Ru layer by a sputtering process. A reflow anneal is performed to eliminate voids in the lines and vias.

17 Claims, 2 Drawing Sheets

METHOD TO FABRICATE COPPER WIRING STRUCTURES AND STRUCTURES FORMED THEREBY

BACKGROUND OF THE INVENTION

1. Field of the Invention

The present invention relates to wiring structures and, more particularly, to techniques for the fabrication of copper (Cu)-filled wiring structures and to the improvement of their performance.

2. Description of Related art

The deposition of copper (Cu) into the narrow copper-filled lines and vias in current high density wiring technologies is accomplished by two quite different key copper deposition steps. The first of these steps, known as seed copper deposition step, involves the sputter deposition (PVD) of a thin layer of copper. The copper thus deposited is highly pure, but the deposition is not highly conformal and consequently, it cannot be used to deposit all of the copper required by the structure to be formed because voids would result, especially in the vias. To compensate for this deficiency, after the deposition of a thin seed layer, the remainder of the copper required is deposited using a second, very different electroplating step. While the copper formed by electroplating is substantially less pure, electroplating process itself is sufficiently conformal to fill the structure without voiding.

It should be noted that electroplating cannot be used alone, without the prior deposition of the seed copper layer because a seed copper layer is required to carry the electric current necessary to initiate the electroplating process.

A high density wiring structure comprises lines and vias. As the filling of the vias in the structure is more difficult than the filling of lines, in the discussion below we shall address the problem of successfully filling vias with void-free Cu. However, it should be understood that lines are also formed and filled by the same copper deposition process or processes that are employed to fill the vias in the structure. For example, in general, conventional techniques used for fabricating a Cu-filled via typically involve first forming a via hole in a dielectric matrix in which the wiring structure is embedded. Second, the via hole is lined with a diffusion barrier to prevent the diffusion of Cu into the dielectric. This diffusion barrier typically includes tantalum nitride (TaN) deposited directly onto the dielectric, and tantalum (Ta) deposited on top of the TaN. Third, a thin layer of seed Cu is sputter deposited onto the exposed Ta surface, in order to prepare the via for electroplating. Fourth, an electroplating process is used to fill the via with Cu.

The fabrication of the wiring structure thus involves two quite dissimilar processes, the PVD process, performed in a high vacuum cluster tool, and the electroplating, an aqueous solution process. It would be desirable from a number of standpoints if the electroplating step could be eliminated and the PVD process used to deposit all of the requisite copper. This approach would first reduce the cost of manufacturing by obviating the need for electroplating tooling. Second, Cu electroplating baths are extremely toxic. If electroplating could be avoided, the expense and risks associated with handling such materials could be eliminated. Third, as noted above, the copper deposited by electroplating is less pure than that deposited by PVD.

Typical impurity levels in the electroplated Cu used to form wiring structures are: carbon (C), 100 parts per million (ppm), chlorine (Cl), 80 ppm, oxygen (O) 80 ppm, and sulfur (S), 50 ppm. These impurities all degrade the conductivity of the copper, and chlorine can in addition cause corrosion which can subsequently lead to the failure of the structure. By contrast, PVD deposited copper typically has impurity levels of less than 20 ppm for each of the aforementioned elements.

In contrast to the impurities C, O, Cl, and S listed above, which are deleterious to the performance of the wiring structure, some impurities such as Boron (B) and Phosphorus (P) can be beneficial. In particular B and P are useful in suppressing electromigration. If all of the Copper in the wiring structure is to be deposited by PVD, and it is deemed desirable to dope the copper with beneficial impurities, it is straightforward to do so with precise control over the concentration of the beneficial impurities (dopants) by the simple method of incorporating them into the Cu sputter target in the requisite concentration. The processing steps described herein below are independent of whether or not the Cu target used for the PVD process contains deliberately introduced dopants. To simplify the discussion below we will take the term "pure Copper" to refer to Copper which is free of deleterious impurities, such as C, O, Cl or S, with the understanding that "pure Copper" may contain deliberately introduced dopants.

In view of the above, it is desirable to develop a technique which provides high purity Cu filled wiring structures using solely a high purity PVD deposited copper process.

SUMMARY OF THE INVENTION

The present invention provides techniques producing Cu filled lines and vias formed entirely from high purity PVD Cu. In one aspect of the invention, a method of fabricating a Cu-filled via is provided. The method includes the following steps. A via is etched in a dielectric. The via is lined with a diffusion barrier. A thin ruthenium (Ru) layer is conformally deposited onto the diffusion barrier. This ruthenium layer is essential for the invention. It provides a surface which the subsequent copper layer wets, making the reflow step described below effective. A thick Cu layer is deposited on the Ru layer by PVD. Depending on the details of the particular structure to be filled This layer can be of a thickness up to 200 nm, in contrast to the thin (<50 nm) Cu seed layers used in the prior art. A reflow anneal is performed to reflow the copper in the structure to eliminate any voids increase a grain size of the seed Cu layer.

In another aspect of the invention, a Cu-filled via formed in a dielectric is provided which includes a via, a diffusion barrier lining the via, a thin Ru layer disposed conformally on the diffusion barrier, a think Cu layer disposed on the Ru layer by PVD and the structure annealed to reflow the Cu and eliminate any voids. The Copper in the structure formed thereby contains less than 40 ppm of carbon and oxygen, and less than 20 ppm of chlorine and sulfur.

A more complete understanding of the present invention, as well as further features and advantages of the present invention, will be obtained by reference to the following detailed description and drawings.

DETAILED DESCRIPTION OF PREFERRED EMBODIMENTS

FIGS. 1-5 are diagrams illustrating an exemplary methodology for fabricating a copper (Cu)-filled via. Advantageously, Cu-filled vias formed using the present techniques have significantly purer copper than those formed by electroplating using the prior art, and can be fabricated without the use of costly electroplating tools or the necessity to handle toxic electroplating solutions. To begin the process, a dielectric is formed over a substrate.

Figure 1:
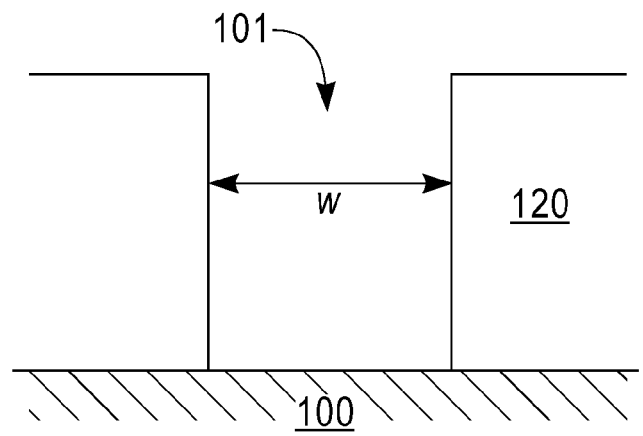
FIG. 1 is a cross-sectional diagram illustrating a dielectric deposited over a substrate and a via etched into the dielectric according to an embodiment of the present invention.

FIG. 1 is a cross-sectional diagram illustrating a dielectric 120 deposited over a substrate 100. Dielectric 120 can comprise any suitable dielectric material, including, but not limited to, one or more of silicon dioxide ($SiO_2$), silicon-carbon-oxygen-hydrogen materials (e.g., SICOH) and organic polymers, and can be deposited using any suitable deposition process, such as chemical vapor deposition (CVD), atomic layer deposition (ALD), evaporation, sputtering or solution based techniques, such as spin-on coating, to a thickness of from about 10 nanometers (nm) to about 1,000 nm. Substrate 100 generally represents any wiring or contact layer in a single or multilayer wiring array. A narrow via 101 is then etched into dielectric 120, using any suitable etching process, such as reactive ion etching (RIE). According to the exemplary embodiment shown in FIG. 1, via 101 is formed having a width w of from about 20 nm to about 50 nm.

Figure 2:
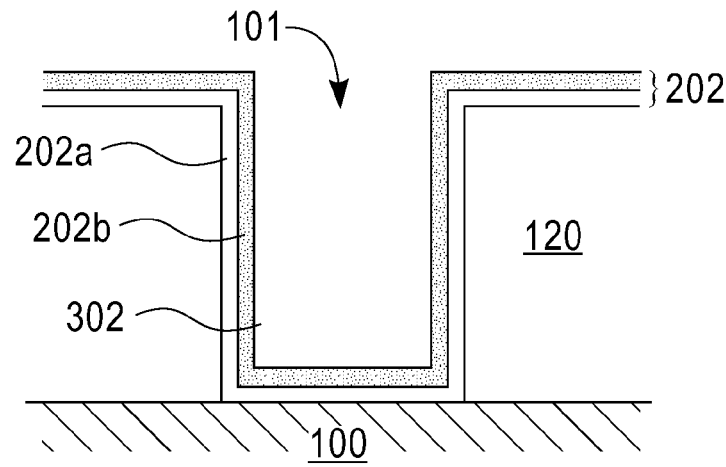
FIG. 2 is a cross-sectional diagram illustrating the via lined with a diffusion barrier according to an embodiment of the present invention.

Next, the via is lined with a diffusion barrier. FIG. 2 is a cross-sectional diagram illustrating via 101 lined with a diffusion barrier 202. According to an exemplary embodiment, diffusion barrier 202 is made up of two layers. The first layer, a tantalum nitride (TaN) layer 202a, is deposited onto dielectric 120, to a thickness of from about 5 nm to about 15 nm, e.g., from about 8 nm to about 12 nm, so as to line the via. The second layer, a tantalum (Ta) layer 202b, is deposited onto TaN layer 202a to a thickness of from about 5 nm to about 15 nm, e.g., from about 8 nm to about 12 nm. Diffusion barrier 202 prevents the diffusion of Cu (see below) into the dielectric.

Figure 3:
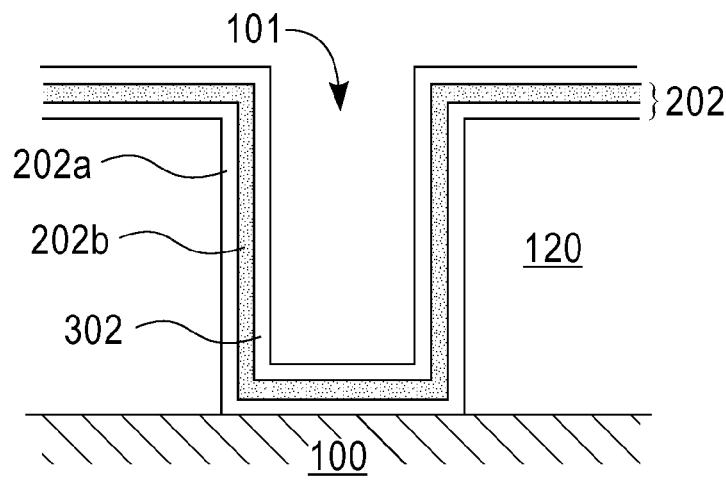
FIG. 3 is a cross-sectional diagram illustrating a ruthenium (Ru) layer deposited onto the diffusion barrier according to an embodiment of the present invention.

A thin ruthenium (Ru) layer is then conformally deposited onto the diffusion barrier. FIG. 3 is a cross-sectional diagram illustrating Ru layer 302 deposited onto diffusion barrier 202 (i.e., onto Ta layer 202b). According to an exemplary embodiment, Ru layer 302 is conformally deposited onto diffusion barrier 202 to a thickness of from about 1 nm to about 10 nm, e.g., from about 2 nm to about 5 nm using CVD or ALD with ruthenium carbonyl as a precursor. CVD or ALD ensures uniform conformal coverage of the Ru on the diffusion barrier Alternatively, Ru layer 302 can be deposited onto diffusion barrier 202 using a sputter deposition process, provided it is sufficiently conformal for the specific structure fabricated.

The inclusion of the Ru layer 302 is critical to the invention. The Ru layer 302 acts as a wetting agent for the PVD Cu layer (see below), to facilitate the reflow of Cu in the reflow anneal (see also below). Accordingly, uniform coverage by the Ru is important to ensure successful reflow.

Figure 4:
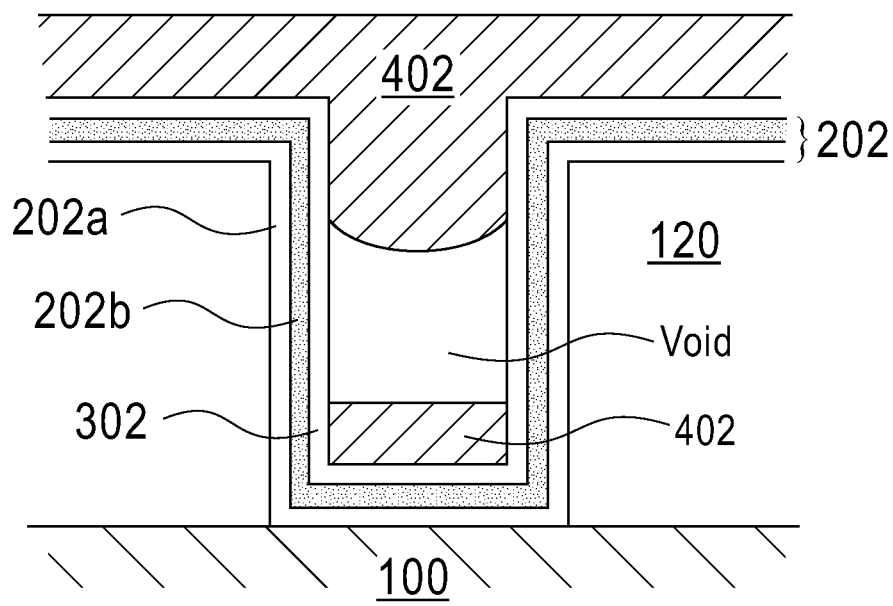
FIG. 4 is a cross-sectional diagram illustrating a thick PVD copper (Cu) layer deposited on the Ru layer according to an embodiment of the present invention. Note the presence of voiding at the bottom of the via

A thick Cu layer is deposited on the Ru layer via PVD. FIG. 4 is a cross-sectional diagram illustrating Cu layer 402 deposited on Ru layer 302. Note that owing to the limited conformality of the PVD process voiding is typically present in the via at this stage, as illustrated. According to an exemplary embodiment, the PVD Cu layer 402 is deposited on Ru layer 302 to a thickness of from about 100 nm to about 200 nm, depending upon the exact topographic details of the wiring structure, such as the density, depth and aspect ratio of the vias. This layer is to be contrasted with the thin Cu seed layers of thickness from about 25 nm to about 35 nm, used in conjunction with prior art electroplating.

Figure 5:
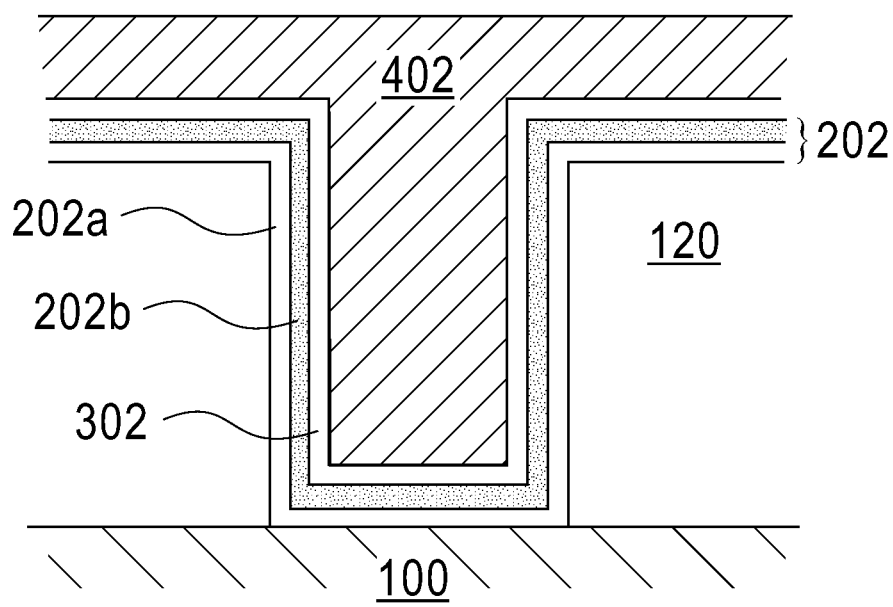
FIG. 5 is a cross-sectional diagram illustrating the structure formed when the structure depicted in FIG. 4 is subjected to a reflow anneal according to an embodiment of the present invention. Note the absence of voids in the bottom of the via.

FIG. 5 is a cross sectional diagram illustrating the effect of anneal performed on the structure illustrated in FIG. 4 to reflow the Cu in the structure and eliminate voids. According to an exemplary embodiment, the anneal is performed at a temperature of from about 150 degrees Celsius (° C.) to about 350° C., e.g., about 250° C., in forming gas (e.g., hydrogen or a mixture of hydrogen with any gas with which the substrate would not react, e.g., nitrogen or a noble gas). According to an exemplary embodiment, the anneal step can be carried out for a period of time from about 15 min. to about 60 min., preferably from about 30 min. to about 45 min. Note that the voiding is eliminated by Cu reflow. Also note that without the introduction of Ru layer 302 this reflow anneal would not be effective because the seed Cu layer would be deposed upon a Ta surface of the diffusion barrier, which is poorly wetted by the Cu. This poor wetting behavior would prevent the Cu from flowing over the Ta in order to eliminate the voids as required.

After the reflow anneal is effected, further processing of the wiring structure can be carried out according to methods known in the prior art.

Although illustrative embodiments of the present invention have been described herein, it is to be understood that the invention is not limited to those precise embodiments, and that various other changes and modifications may be made by one skilled in the art without departing from the scope of the present invention.

What is claimed is:

1. A method of fabricating a wiring structure comprising etching an opening into a dielectric layer;
lining said opening with a diffusion barrier;
depositing a conformal ruthenium layer onto said diffusion barrier;
depositing a copper layer onto said ruthenium layer by sputter deposition, wherein said copper layer comprises a first portion completely filling a bottom portion of said opening and a second portion completely filling an upper portion of said opening, wherein said portion is in direct contact with inner sidewalls of said conformal ruthenium layer, and wherein said first portion and said second portion of said copper layer are completely separated by a void; and
performing a reflow anneal on said wiring structure, wherein said reflow anneal produces a void-free copper-filled structure.

2. The method of claim 1, wherein said lining wherein of said opening with the diffusion barrier comprises
depositing a tantalum nitride layer onto the dielectric layer; and
depositing a tantalum layer onto the tantalum nitride layer.

3. The method of claim 2, wherein the tantalum nitride layer is deposited to a thickness of from about 5 nanometers to about 15 nanometers.

4. The method of claim 2, wherein the tantalum nitride layer is deposited to a thickness of from about 8 nanometers to about 12 nanometers.

5. The method of claim 2, wherein the tantalum layer is deposited to a thickness of from about 5 nanometers to about 15 nanometers.

6. The method of claim 2, wherein the tantalum layer is deposited to a thickness of from about 8 nanometers to about 12 nanometers.

7. The method of claim 1, wherein the ruthenium layer is deposited to a thickness of from about 1 nanometer to about 10 nanometers.

8. The method of claim 1, wherein the ruthenium layer is deposited to a thickness of from about 2 nanometers to about 5 nanometers.

9. The method of claim 1, wherein the ruthenium layer is deposited onto the diffusion barrier using chemical vapor deposition.

10. The method of claim 9, wherein ruthenium carbonyl is used as a precursor for the chemical vapor deposition.

11. The method of claim 1, wherein the ruthenium layer is deposited onto the diffusion barrier using atomic layer deposition.

12. The method of claim 11, wherein ruthenium carbonyl is used as a precursor for the atomic layer deposition.

13. The method of claim 1, wherein the ruthenium layer is deposited onto the diffusion barrier using a sputter deposition process.

14. The method of claim 1, wherein the copper layer is deposited to a thickness of from about 50 nanometers to about 300 nanometers.

15. The method of claim 1, wherein the copper layer is deposited to a thickness of from about 100 nanometers to about 200 nanometers.

16. The method of claim 1, wherein the reflow anneal is performed at a temperature of from about 150° C. to about 350° C. in forming gas.

17. The method of claim 16, wherein the reflow anneal is performed for a time between 15 and 60 min.

* * * * *